United States Patent [19]
Park et al.

[11] Patent Number: 5,357,127
[45] Date of Patent: Oct. 18, 1994

[54] PIN HETEROJUNCTION PHOTO DIODE WITH UNDERCUT GATE JIFET

[75] Inventors: Ki S. Park, DongKu; Kwang Y. Oh, Yuseongku; Yong T. Lee, Jungku, all of Rep. of Korea

[73] Assignee: Electronics and Telecommunications, Daejeon, Rep. of Korea

[21] Appl. No.: 964,113

[22] Filed: Oct. 20, 1992

Related U.S. Application Data

[63] Continuation of Ser. No. 634,540, Dec. 27, 1990, abandoned.

[30] Foreign Application Priority Data

Dec. 30, 1989 [KR] Rep. of Korea ............... 1989-20674

[51] Int. Cl.⁵ ......................................... H01L 27/14
[52] U.S. Cl. ................... 257/189; 257/257; 257/279; 257/458
[58] Field of Search .............. 357/22, 30, 15; 257/257, 258, 279, 458, 184, 189, 192

[56] References Cited

U.S. PATENT DOCUMENTS

| | | | |
|---|---|---|---|
| 4,777,516 | 10/1988 | Deschler et al. | 357/17 |
| 5,032,885 | 7/1991 | Shiga | 357/22 |
| 5,034,794 | 7/1991 | Murotani | 357/22 |

*Primary Examiner*—William D. Larkins
*Attorney, Agent, or Firm*—Blakely, Sokoloff, Taylor and Zafman

[57] ABSTRACT

This invention provides an opto-electronic integrated circuit for receiving optical signals as well as method for manufacturing the same in which both the receipt sensitivity and reliability are improved to achieve both high operation speed and process simplicity. This is accomplished by integrating the photo-detector and the amplifier on a single chip, which are essential elements of the optical receiver of the optical communication system. Also, layer between a PIN photo-detector and a junction-field effect transistor (JFET) is shared as large as possible through a two times epitaxial growth. In this way, the opto-electronic integrated circuit is optimized.

4 Claims, 5 Drawing Sheets

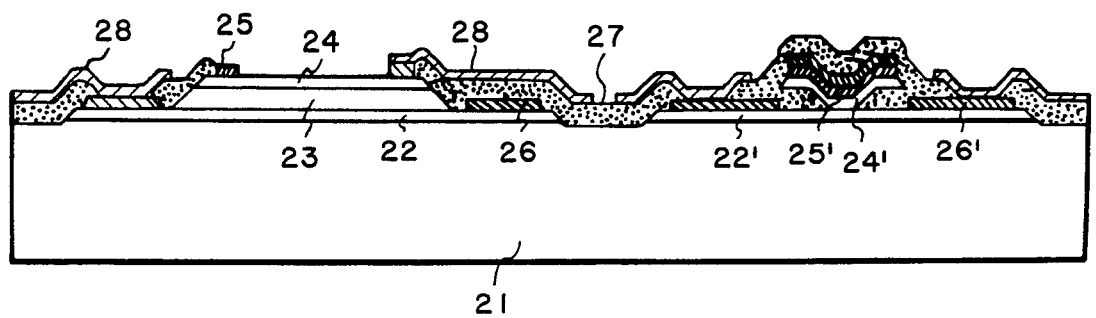
FIG.2
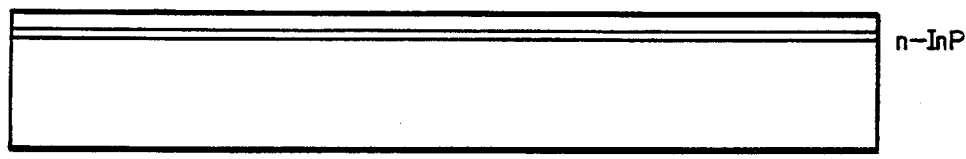
FIG.3A  undoped −InGaAs
n−InP
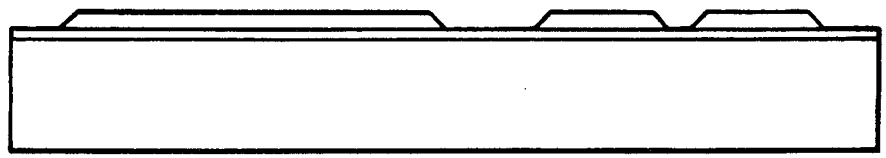
FIG.3B
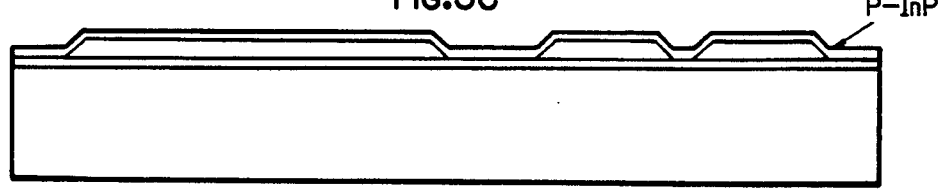
FIG.3C  P−InP n type metal (Polyimide)

wiring metal

PIN HETEROJUNCTION PHOTO DIODE WITH UNDERCUT GATE JIFET

This is a continuation of application Ser. No. 07/634,540 filed Dec. 27, 1990, now abandoned.

BACKGROUND OF THE INVENTION

This invention relates to a structure and fabrication process of a monolithic opto-electronic integrated circuit using PIN photodiode and junction field effect transistor for improving receiver sensitivity and bit rate.

The important objectives for determining the structure of the opto-electronic integrated circuit for receiving optical signals are, 1) to optimize independently the structure and manufacturing process of the two elements, i.e., the photo-detector and the transistor, both of which require different structures and manufacturing processes, and 2) to connect the elements electrically.

The development stages of the structure of the opto-electronic integrated circuit for receiving optical signals as shown in FIG. 1, is summarized in the order in which development progressed:

FIG. 1a shows a common epi-layer structure where both the photo-detector and the transistor use the same epitaxial layer;

FIG. 1b shows a non-planar structure where the photo-detector and the transistor are integrated in disregard of the differences between their heights;

FIG. 1c shows a groove structure where the position of the optical detector is engraved deeply, since the thickness of the optical detector is thicker than that of the transistor, so that the resulting height of the optical detector and the transistor are the same;

FIG. 1d shows a graded structure wherein the edges of the elements are inclined in order to reduce the problems caused by the differences in their heights above the surface after the etching process;

FIG. 1e shows a planar buried structure where an photo detector is buried in order to make a perfect planar structure; and FIG. 1f shows a planar compatible structure wherein the structures of the planar type electronic elements as well as their processes stand alone as a result of the optical detector's use with the planar structure.

The processes used for forming the structures of prior art opto-electronic integrated circuits will now be described.

A structure sharing an epitaxial layer (a) is formed by growing a single InGaAs layer on a semi-insulated InP substrate before integrating a PIN optical detector and a junction field effect transistor therein. This is an initial stage of the structure including the first integrated circuit for receiving optical signals. The fabrication of this structure is easy because it only requires one epitaxial growth. However, the performance of the elements in this structure easily deteriorate because it is impossible to independently optimize the structure of the elements due to both the differences in the doping concentrations and the thickness between the PIN photo-detector and the transistor channel layer.

A non-planar structure (b) can be formed by a single epitaxial growth of separate PIN photo detector and FET layers. This structure of the elements can be easily optimized independently of each other because the transistor's channel layer and the optical detector's absorption layer are different. However, if the PIN optical detector is thick, it may cause difficulties in photolithography. It is important to note that the PIN detector's absorption layer and the n layer can be etched selectively. This structure presents a similar case to that of (a), in that the parasitic capacitance is also a severe problem.

In the groove type structure (c), since the photodetector is about 2 to 3 $\mu m$ thicker than the transistor, the semi-insulated substrate is groove-etched to a depth of 2 to 3 $\mu m$ before the optical detector is positioned in the groove. This type of the structure has a photo-lithographic advantage compared with the non-planar type structure (b). However, problems still remain in the electrical interconnection between the photo-detector and the transistor. Also, the interconnection capacitance is relatively large.

A graded type structure (d) is a structure for reducing the problems caused by the differences in surfaces' heights. This structure may reduce the problems in photo-lithography and interconnection, as well as the parasitic capacitance. While the elements of this structure perform well, it does have the disadvantage that it requires the graded structure to be manufactured using ion beam etching, which is very difficult.

A planar buried type structure (e) has completely resolved the problems in the difference between the heights of the surfaces so that it accomplishes the photo-lithography process and also reduces the interconnection parasitic capacitance. This structure can be formed by filling an etched groove using either liquid phase epitaxial growth, two ion beam etches, or a selective organo-metallic vapor phase epitaxial growth. In the method that uses the liquid epitaxial growth, the region of the photo-detector was limited. In the method that uses ion beam etching, careful control of the process is required. In the method that uses the selective epitaxial growth, it has the disadvantage that the poly-crystal sometimes grows on the material used as a mask so that the edge portions of the growing region may become over-grown.

In the planar compatible structure (f), a planar photodetector that uses a substrate as an absorption layer is integrated together with a transistor, such as MESFET. This structure can accomplish the two goals of 1) having a simple manufacturing process and 2) achieving a planar structure. However, the development of the planar photo-detector has not been completed until now. This structure is difficult to manufacture in a InP family which uses an InGaAs layer as an absorption layer.

Other than the structures described above, a vertical structure has been invented in which an n type substrate PIN photo-detector was formed, and a semi-insulated layer was then epitaxially grown thereon before the field effect transistor was formed using an ion implant process. Also disclosed was a method for integrating an InGaAs photo-detector and a GaAs MESFET on a GaAs substrate using a lattice mismatched epitaxy and a method for integrating a GaAs MESFET on an InP substrate.

SUMMARY OF THE INVENTION

One objective of this invention is to solve the problems presented by the prior art, as described above.

Another objective of this invention is to provide an opto-electronic integrated circuit for receiving optical signals as well as a method for manufacturing the same in which both the receipt sensitivity and reliability are improved to achieve both high operation speed and process simplicity. This is accomplished by integrating the photo-detector and the amplifier on a single chip, which are the essential elements of the optical receiver of the optical communication system. Also, a layer between a PIN photo-detector and junction-field effect transistor (JFET) is formed through two epitaxial growths having a shared region between the elements being as large as possible both the operation and manufacturability of. In this way, the opto-electronic integrated circuit is optimized.

In order to accomplish the above objectives of this invention, a method for manufacturing a photo-detector and an amplifier, i.e., the essential elements of the optical receiver of the optical system integrated on a single chip, comprises the following steps: a first epitaxial process for growing a channel layer and an undoped optical absorption layer sequentially on a semi-insulated InP substrate through an epitaxial growth, a first etching process for anisotropically and selectively etching only the optical absorption layer after the masking process so as to make an InP layer appear, a second epitaxial process for growing a clad layer to a certain thickness through an epitaxial growth after eliminating all of the photoresist for the mask, a p type metallization process for depositing the p type metal by a lift-off process in order to make an ohmic contact between the PIN optical detector and the field effect transistor which is then annealed with a high speed thermal processing apparatus, a second etching process for forming a photo resist on the optical absorption region of the optical detector and for selectively etching the gate of the field effect transistor using the p type metal formed during previous process as an etching mask, a third etching process for selectively etching only the optical absorption layer exposed at the surface after the above selective etching process of the second etching process, a n type metal vapor deposition process for vapor depositing the n type metal using the lift-off process in order to make an ohmic contact in the optical detector and the source and the drain of the field effect transistor, a polyamide passivation process for coating the polyimide in the PIN optical detector and the field effect transistor which is also etched in the optical absorption windows and the wire contact portions making electrical connections among the elements, and a second metal contact vapor deposition process for depositing the second metal contact portion.

In order to accomplish the objectives of the invention, the structure of the optical integrated circuit for receiving optical signals which comprises the following a semi-insulated InP substrate; a PIN optical detector that includs a n type InP channel layer formed on the semi-insulated substrate, an InGaAs optical absorption layer formed in the center of the n type channel layer, a n type metal vapor-deposited on either side of the InGaAs absorption layer on the n type channel layer, a p type InP clad layer formed on the InGaAs absorption layer, and a p type metal vapor-deposited on either side of the p type InP clad layer; a field effect transistor including a n type InP channel layer formed on the semi-insulated substrate, a p type InP clad layer formed in the center of the n type InP channel layer in the form of a structure in which both sides of the clad layer are under-cut in a wing shape, a p type metal vapor-deposited on the p type InP clad layer and a n type layer vapor-deposited on the p type metal as well as on both sides of the p type InP clad layer formed on the n type InP channel layer; a polyimide coated on all of the portions except for the optical absorption window portions of the optical detector and the metal contact portions used to electrically-wire the elements; and a metal layer for electrical wiring.

BRIEF DESCRIPTION OF THE DRAWINGS

Other features of the present invention will be more readily understood from the following detailed description of the specific embodiments thereof, when read in conjunction with the accompanying drawings in which:

FIG. 2 shows a cross sectional view of an embodiment of an InP family optical integrated circuit for a receiver in accordance with the invention;

FIG. 3(A) to (I) show a cross sectional view of an optical integrated circuit for a receiver in the sequence of manufacturing in accordance with the invention;

DETAILED DESCRIPTION OF THE PREFERRED EMBODIMENTS

Figure 1A:
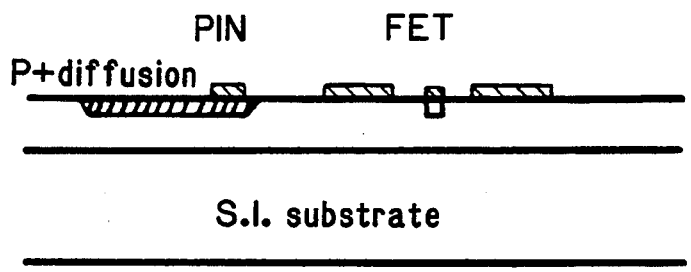
FIG. 1 shows a cross sectional view of a structure of a conventional optical integrated circuit for a receiver.
Figure 1B:
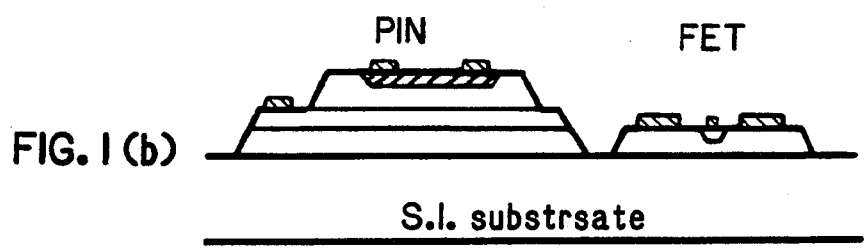
Figure 1C:
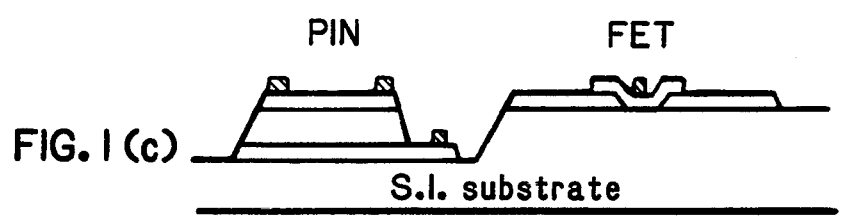
Figure 1D:
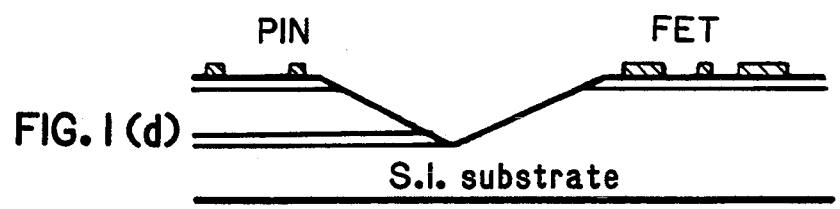
Figure 1E:
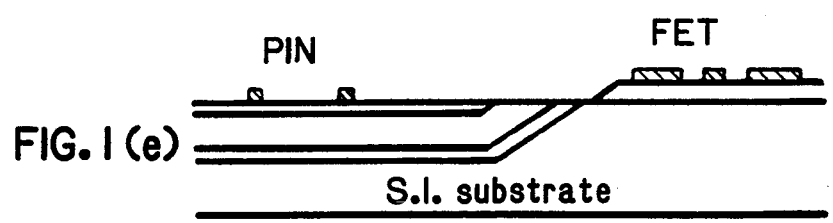
Figure 1F:
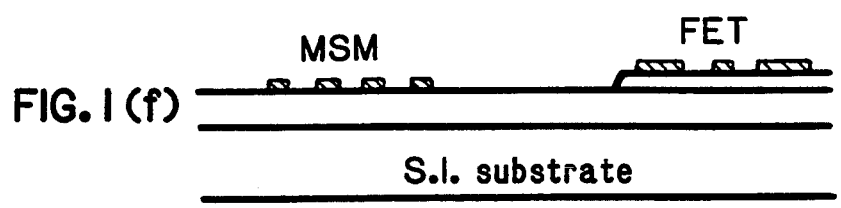
Figure 3D:
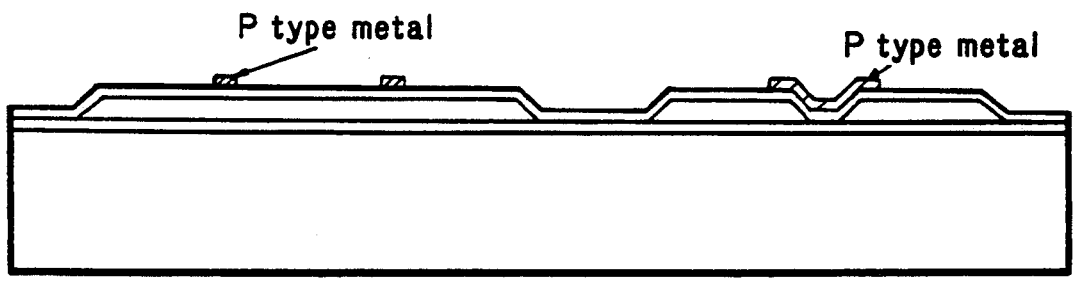
Figure 3E:
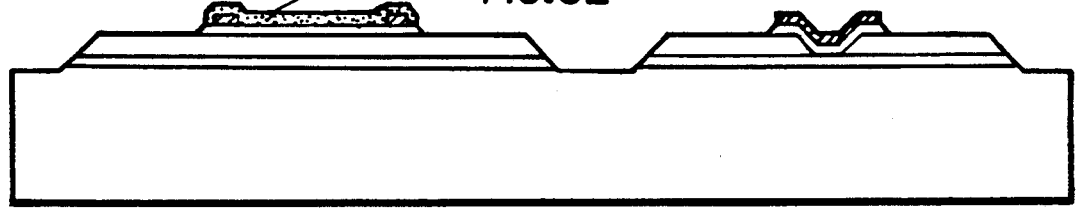
Figure 3F:
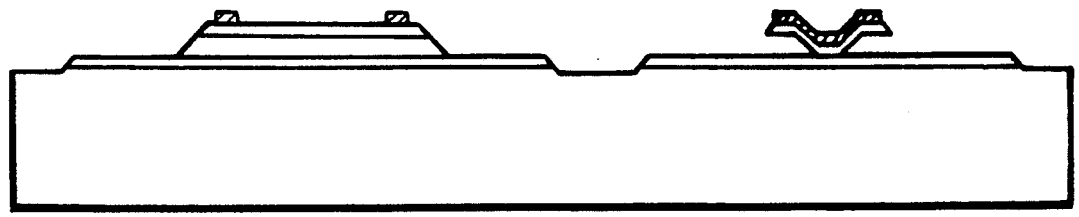
Figure 3G:
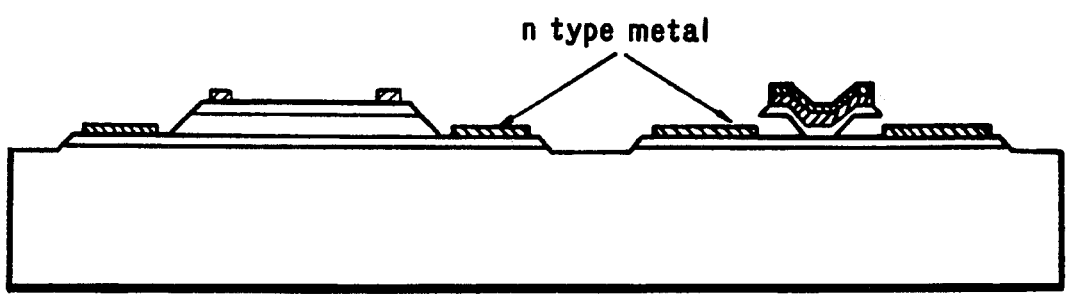
Figure 3H:
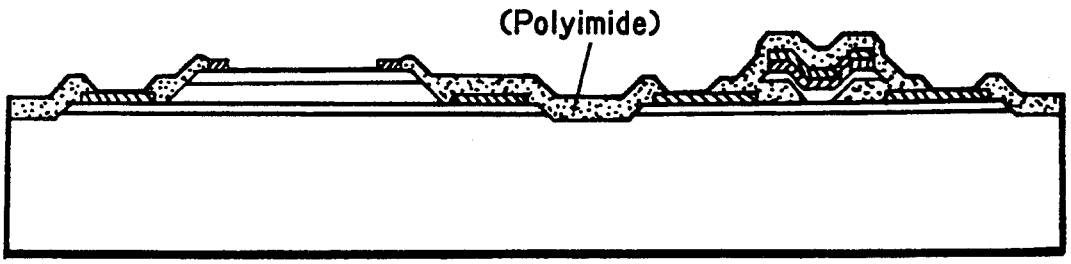
Figure 3I:
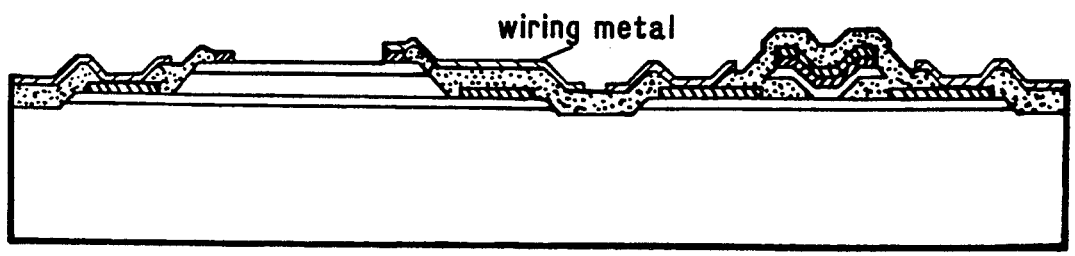

FIG. 2 shows a cross sectional view of an embodiment of an InP family optical integrated circuit, in accordance with the invention. This embodiment shows a planar optical integrated circuit integrated on a single chip having a structure which comprises:

a semi-insulated InP substrate (21); a PIN optical detector including a n type Indium Phosphide (InP) channel layer(22) formed on the semi-insulated substrate(21), an undoped Indium Gallium Arsenide (InGaAs) absorption layer(23) formed on the n type InP channel layer(22), a p type InP clad layer (24) formed for the PN junction after selectively and anisotropically etching only the InGaAs absorption layer (23) in order to expose an In layer(111), a p type metal (25) vapor-deposited on the p type InP clad layer(24), and a n type metal (26) vapor-deposited on the n type InP layer(22) except for the InGaAs absorption layer after the InP layer has been selectively etched (the terms p type metal and n type metal refer to metals which form ohmic contacts with P type and N type semiconductors, respectively);

a junction field effect transistor including an n type InP channel layer (22') formed on the semi-insulated substrate (21) through an epitaxial growth after the InGaAs layer has been grown on the n type InP channel layer (22'), a p type metal (25') vapor-deposited on the p type InP layer (24') and a n type metal (26') formed in a self-aligned structure through a vapor deposition after etching the InP layer (24') selectively using the p type metal as a mask and then etching all of the InGaAs layer;

A polyimide (27) coated for reducing leakage current, and metal contacts (28) vapor-deposited for electrically wiring among the elements.

This structure integrates in a planar form the PIN optical detector using In(0.53)Ga(0.47)As lattice-maching with the InP layer as an absorption layer, and a junction field effect transistor using the n type InP layer as a channel layer so as to make use of the following characteristics: This structure makes use of the advantages of both the conventional non-planar type structure and the conventional groove type structure. In addition, independent optimization between the optical detector and the junction field effect transistor can be accomplished. Three layers grown through two epitaxial growth process are shared between the optical detector and the transistor. The growth characteristic of the n type InP clad layer is determined by the transistor, that of the undoped InGaAs absorption layer is determined by the optical detector and that of the p type InP clad layer is determined by both the optical detector and the transistor. Furthermore, micro-lithography is made possible without forming a recess groove in the substrate. In other words, since the lithography process for forming the gate of the transistor is performed such that there is no difference in height of the surface after the first epitaxial growth, the micro-lithography process is made possible.

The structure according to the invention overcomes the limitation in the length of the gate formed by diffusion which was a severe problem in manufacturing the conventional junction field effect transistor, and by using an anisotropic etch of the InGaAs layer, it obtains a gate length shorter than that on the mask determined by lithography.

Also, in accordance with this invention, a junction field effect transistor having a gate length less than or equal to 1 $\mu$m can be easily manufactured without expensive electron beam or X-ray lithography equipment by vapor depositing a source, a drain and a gate metal through a self-alignment process.

After anisotropically and selectively etching only the InGaAs layer among the n type InP channel layer grown on the semi-insulated InP substrate and the undoped InGaAs layer for exposing the In layer (111) by using a selective-etchant and growing the p type InP layer for forming a PN junction, the PN junction between the layer under the etched portion and the channel layer is formed for the gate.

At this time, the length of the gate in which the PN junction is formed is determined by three factors: 1) the thickness of the InGaAs layer, 2) the anisotropic etching angle and 3) the length of the mask for the etch.

Also, an integrated density of the optical detector and the transistor can be extended without modifying the basic structure. In addition, it is easy to regulate the etching process even though a multitude of such processes are required in order to selectively etch the InP layer and the InGaAs layer. Although the mesa etching process, which electrically disconnects the electrical elements, creates relatively great differences in the heights of the surfaces, this process has no effect on the lithography, since this pattern for the portion is very large. If the polyimide is coated on the structure and the grade of the etched portion is lowered to form the wiring of the p type metal and to accomplish passivation, the leakage current can be reduced.

FIG. 3 shows a cross sectional view of the optical integrated circuit in the order of its manufacturing sequence.

In the first eptitaxial process (A), both a n type InP channel layer and an undoped InGaAs absorption layer are grown on a semi-insulated InP substrate using either a liquid phase epitaxial growth or an organo-metallic vapor phase epitaxial growth.

During the InGaAs layer etching process (B), an etching mask is formed with a photo-sensitive material through the use of a lithography process. Next, the anistropic etching process is used in order to make the (111) In layer of the InGaAs layer. Then, etching of the separation regions (i.e., where the elements are not located for disconnection) and the gate region (i.e., where the PN junction of the transistor is formed) is performed.

During the second epitoxial process (C), all of the photo-sensitive material is eliminated and the p type InP layer is grown to a certain thickness using the organo-metallic vapor phase epitaxial process in order to form the PN junctions of the optical detector and the junction field effect transistor.

During the p type metal vapor deposition process (D), the p type metal is vapor-deposited through a lift-off process in order to form ohmic contacts in the optical detector and the transistor gate. The annealing process is then followed by a heat treatment in a high speed heat apparatus.

During the InP layer (E) etching process, the optical absorption region of the PIN optical detector is covered with photo-sensitive material using the lithography process. Only the InP layer is selectively etched while the p type metal vapor-deposited on the gate region of the transistor serves as an etching mask.

Since both the p-InP layers and the n-InP layer are etched in the region where there is no InGaAs layer, a semi-insulated substrate is exposed and the elements are electrically disconnected.

In the region where there is an InGaAs layer, only the p-InP layer is etched in order to expose the InGaAs layer.

During the InGaAs layer etching process (F), when only the InGaAs layer is etched right after the InP layer has been etched, the n-InP layer of the optical detector is exposed except for its optical absorption layer. Also, all of the InGaAs layer of the transistor is etched in order to create under-cut portions of the p type InP clad layer on both sides of the PN junction which form a wing-shaped cross-section or a "V"-shaped cross-section of the InP clad layer having a bottom in contact with the n type InP channel layer and a top with two outwardly extending arms each having a flange extending outward in a generally parallel direction to the n type InP channel layer.

During the n type metal vapor deposition process (G), the n type metal is vapor-deposited in order to form ohmic contacts, through the lift-off process in the optical detector and the source and the drain regions of the transistor. Even though the metal is deposited without distinguishing the source, the drain and the gate of the transistor, they align themselves due to the under-cut formed during the previous process.

During the polyimide passivation process (H), a polyimide is coated in order to reduce current leakage from the optical detector as well as to reduce the detector's grade. The polyimide is then etched in portions of the optical detector's photo-absorption window as well as those portions of the second set of metal contacts needed for wiring among the elements.

During the second metal contact vapor-deposition process (I), the second set of metal contacts are vapor-deposited through the lift-off process in order to electrically wire the elements together.

Figure 4:
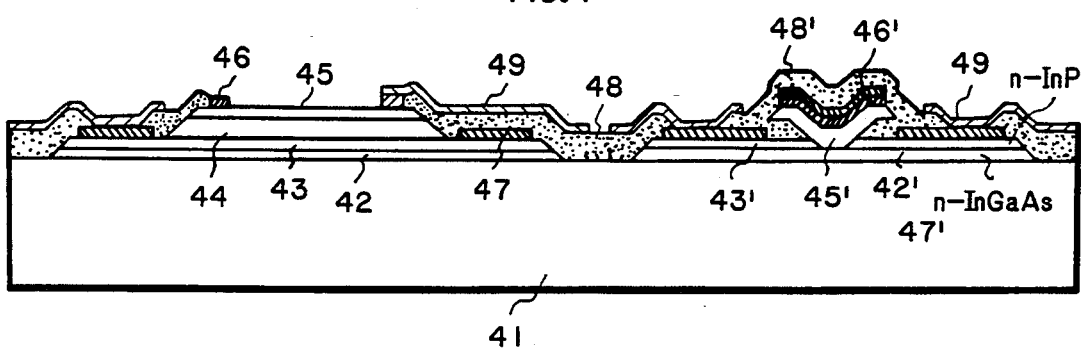
FIG. 4 shows a cross sectional view of an another embodiment of an optical integrated circuit for a receiver, in accordance with the invention.

The invention can also be modified and applied in several alternate embodiments as FIG. 4 shows a cross sectional view of another example of the invention in which the optical integrated circuit comprises:

a semi-insulated substrate (41); a PIN optical detector including a n type InGaAs channel layer (42) formed on the semi-insulated substrate, a n type InP ohmic contact layer (43) formed on the n type channel layer, an undoped InGaAs abortion layer (44) formed on the ohmic contact layer, a p type clad layer (45) formed after anisotropically etching the InGaAs absorption layer, a p type metal (46) vapor-deposited on the clad layer and a n type metal (47) vapor-deposited on the n type InP ohmic contact layer (except the InGaAs absorption layer) after the InP layer has been selectively etched;

a junction field effect transistor including a n type InGaAs channel (42') formed on the same semi-insulated substrate, a n-InP ohmic contact layer (43') formed on the channel layer, a p type InP clad layer (45') formed on the ohmic contact layer, a p type metal (46') vapor-deposited on the clad layer and an n type metal (47') vapor-deposited onto both the p type metal and the n type InP ohmic contact layer;

A polyimide (48) coated on the detector, the transistor, and the metal contacts which are (49) vapor-deposited for wiring among elements.

The optical integrated circuit for the receiver with the above described structure can be fabricated in the sequence which will now be described. During the first epitaxial process, the n type InGaAs channel, the n type InP ohmic contact layer and the undoped InGaAs absorption layer are formed on the semi-insulated InP substrate using either a liquid phase epitaxial growth or an organometallic vapor-phase epitaxial growth.

During the InGaAs layer etching process, an etching mask is formed with a photo-sensitive material through lithography. The mask is then anisotrophically and selectively etched in order to expose both the InGaAs absorption layer and the InP ohmic contact layer. At this time, in the etched portion a PN junction is formed between the transistor and the separation region where the elements are not located so as to serve as a gate.

During the second epitaxial process, after eliminating all of the etching mask's photo-sensitive material, the p type InP clad layer is grown using the organometallic vapor phase epitaxial growth in order to form a PN junction between the optical detector and the junction field effect transistor.

During the p type metal vapor deposition process, the p type metal is deposited through the lift-off process in order to form ohmic contacts in the optical detector and the transistor gate, and the p type metal is then annealed in the high speed heat treatment apparatus.

During the InP layer etching process, the optical absorption region of the PIN optical detector is covered with photo-sensitive material by lithography. In the gate portions of the transistor, the p type metal that was deposited during the previous process serves as an etching mack. Then, the InP layer is etched selectively. Since the p type InP layer is completely etched in the region containing no InGaAs layer, the semi-insulated substrate electrically disconnects the elements. In the region where there is an InGaAs layer, only the p type InP layer is etched in order to expose the InGaAs layer.

During the InGaAs layer etching process, upon selectively etching the InGaAs layer immediately after etching the InP layer, the n type InP layer (except for its optical absorption layer) in the optical detector is exposed. Also, the InGaAs layer of the transistor is completely etched so as to form under-cut portions in either side of the PN junction.

During the n type metal vapor deposition process, the n type metal is vapor-deposisted in order to form ohmic contacts in the optical detector, the transistor source and transistor drain using the lift-off process. Although, the metal is deposited without distinguishing the source, the drain and the gate of the transistor, each electrode is self-aligned due to the under-cut formed during the previous process.

During the polyimide passivation process, a polyimide is coated in order to mitigate the grade of the optical detector as well as to reduce the leakage of current from both the optical detector and the transistor. Then, the polyimide is selectively etched in the portions provided for the optical detector's optical absorption window as well as those portions required for wiring the second metal contact regions among the elements.

During the second metal contact vapor deposition process, the second metal contact region is vapor-deposited by the lift off process in order to electrically wire the elements together.

Figure 5:
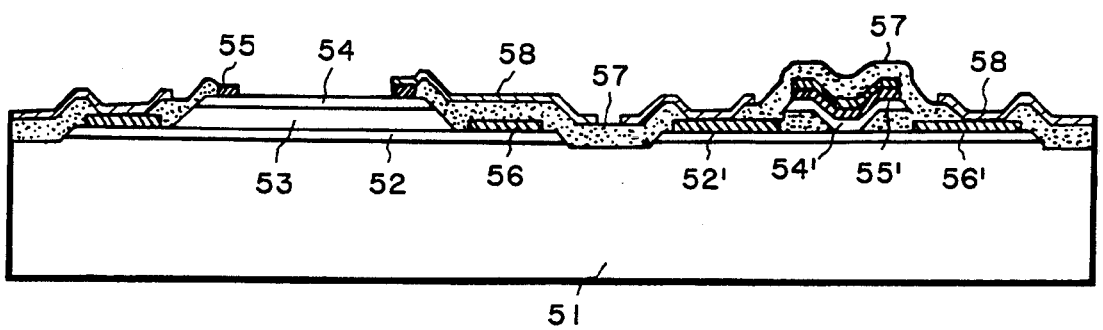
FIG. 5 shows a cross sectional view of an another embodiment of an optical integrated circuit for a receiver, in accordance with the invention.

The optical integrated circuit of the invention may be applied to the Gallium Arsenide (GaAs) family, without altering the structure shown in FIG. 5. As an example, instead of growing the semi-insulated InP layer, the n type InP channel layer and the p type InP clad layer, the semi-insulated GaAs substrate, the n type Gallium Aluminum Arsenide (GaAlAs) layer and the GaAlAs clad layer may be respectively grown. As another example, in order to reduce the resistance in the contacts of the electrodes, either a diffusion process or an ion injection process may be added in the lower portion of the electrode in order to reduce the contact resistances of the electrodes.

The invention can be applied to the integration of such planar optical detectors as a lateral PIN, PCD (photo-conductive detector) or MSM (Metal semiconductor metal).

Since the polyimide coated for grade mitigation and surface passivation has a permitivity of 3.0 to 3.5, it can be used as a non-reflective coating on the optical detector. The optical detector in the single chip optical integrated circuit of this invention has the following advantages:

1) Since, as in almost all the optical integrated circuits, the optical detector having a thickness of several $\mu$m and the field effect transistor having thickness of less than 1 $\mu$m are integrated on a single chip, there is a restriction in the micro-lithography process due to differences in the heights of their surfaces. Thus, the fabrication of a transistor having a short gate length had been difficult. Accordingly, in the conventional structures, the optical detector was either buried planarly or a planar optical detector having a relatively slight difference in the height of its surface was used. However, the use of either the ion beam etching process or the selective epitaxial process with the planar optical detector had been very difficult due to the fact that the reliability was low. The performance and the reliability of such planar optical detectors such as the PCD or the MSM was lower than those of the vertical PIN optical detector, and the materials used for the planar optical detector was thus very limited.

According to the invention, a PIN optical detector having excellent performance characteristics is used. The micro-lithography process that determines the gate length of the transistor is performed in such a manner that there is no difference in the height of the surface after the first epitaxial process. Thus, transistors with a short gate length can be manufactured according to the invention.

2) Since the field effect transistor has a self-aligned structure, it is simple to fabricate.

3) Since the polyimide which is coated for surface passivation mitigates the grade of the optical detector, wiring between the elements is easily accomplished. Also, a polyimide is an excellent material for reducing current leakage from the PN junction. Accordingly, various results can be achieved by means of a single process.

What is claimed is:

1. A circuit integrating an optical detector and an amplifier on a single chip, comprising:
   a semi-insulating InP substrate;
   a PIN optical detector having a n type Inp first layer formed on the semi-insulating InP substrate, an undoped InGaAs optical absorption layer formed on the n type InP first layer, a p type InP clad layer formed on the undoped InGaAs optical absorption layer, a first metal formed on the p type InP clad layer, and a second metal formed on the n type InP first layer, the first and second metals comprising a metal capable of forming ohmic contacts with P-type semiconductors and N-type semiconductors, respectively;
   a self-aligned field effect transistor having a n type InP channel layer formed on the semi-insulating InP substrate, a p type InP gate layer formed on the n type InP channel layer to act as a gate of the transistor, the p type InP gate layer being undercut on two sides to form a generally "V"-shaped cross-section of the p type InP gate layer having a bottom in contact with the n type InP channel layer and a top with two outwardly extending arms each having a flange extending outward in a generally parallel direction to the n type InP channel layer, a third metal formed on the p type InP gate layer, and a fourth metal formed on the n type InP channel layer, the third and fourth metals comprising a metal capable of forming ohmic contacts with P-type semiconductors and N-type semiconductors, respectively;
   a polyimide coated on all portions except an absorption window of the PIN optical detector as well as metal contact holes for electrical interconnections among elements; and
   an interconnection metal for electrically wiring the elements.

2. A circuit integrating an optical detector and an amplifier on a single chip comprising:
   a semi-insulating GaAs substrate;
   a PIN optical detector having a n type GaAlAs first layer formed on the semi-insulating GaAs substrate, an undoped GaAs absorption layer formed on the n type GaAlAs first layer, a p type GaAlAs clad layer formed on the undoped GaAs absorption layer, a first metal formed on the p type GaAlAs clad layer, and a second metal formed on the n type GaAlAs first layer, the first and second metals comprising a metal capable of forming ohmic contacts with P-type semiconductors and N-type semiconductors, respectively;
   a self-aligned field effect transistor having a n type GaAlAs channel layer formed on the semi-insulating GaAs substrate, a p type GaAlAs gate layer formed on the n type GaAlAs channel layer to act as a gate of the transistor, the p type GaAlAs gate layer being undercut on two sides to form a generally "V"-shaped cross-section of the p type GaAlAs gate layer having a bottom in contact with the n type GaAlAs channel layer and a top with two outwardly extending arms each having a flange extending outward in a generally parallel direction to the n type GaAlAs channel layer, a third metal formed on the p type GaAlAs gate layer, and a fourth metal formed on the n type GaAlAs channel layer, the third and fourth metals comprising a metal capable of forming ohmic contacts with P-type semiconductors and N-type semiconductors, respectively;
   a polyimide coated on all portions except an absorption window of the PIN optical detector as well as metal contact holes for electrical interconnections among elements; and
   an interconnection metal for electrically wiring the elements.

3. A circuit according to claim 1, wherein the InGaAs optical absorption layer of the PIN optical detector comprises a composition of In (0.53) Ga (0.47) As, the PIN optical detector and the self-aligned field effect transistor being monolithically integrated.

4. A circuit according to claim 1 wherein said PIN optical detector having an optical absorption layer of IN (0.53) Ga (0.47) As and said self-aligned field effect transistor are integrated monolithically.

* * * * *